United States Patent
Suenaga et al.

(10) Patent No.: US 6,569,696 B2
(45) Date of Patent: May 27, 2003

(54) DEVICE AND METHOD FOR MANUFACTURING SEMICONDUCTOR

(75) Inventors: Osamu Suenaga, Nirasaki (JP); Makoto Yamamoto, Nirasaki (JP); Naoki Mori, Tokyo (JP); Hiromu Ito, Tokyo (JP); Sadao Kobayashi, Tokyo (JP)

(73) Assignees: Tokyo Electron Limited, Tokyo (JP); Taisei Corporation, Tokyo (JP)

( * ) Notice: Subject to any disclaimer, the term of this patent is extended or adjusted under 35 U.S.C. 154(b) by 0 days.

(21) Appl. No.: 10/148,664
(22) PCT Filed: Apr. 10, 2001
(86) PCT No.: PCT/JP01/08764
§ 371 (c)(1), (2), (4) Date: Jun. 4, 2002
(87) PCT Pub. No.: WO02/29864
PCT Pub. Date: Apr. 11, 2002

(65) Prior Publication Data
US 2002/0179283 A1 Dec. 5, 2002

(30) Foreign Application Priority Data
Oct. 4, 2000 (JP) ........................................ 2000-305067

(51) Int. Cl.⁷ .......................... G01R 31/26; H01L 21/66; B01L 1/04
(52) U.S. Cl. .......................... 438/14; 438/780; 438/800; 165/11.1; 165/253; 454/187; 454/188
(58) Field of Search .................. 438/14, 778, 780, 438/800; 118/52; 427/240; 165/11.1, 253; 454/187, 188

(56) References Cited

U.S. PATENT DOCUMENTS

| | | | | |
|---|---|---|---|---|
| 5,143,552 A | * | 9/1992 | Moriyama | 118/666 |
| 6,306,455 B1 | * | 10/2001 | Takamori et al. | 427/8 |
| 6,326,597 B1 | * | 12/2001 | Lubomirsky et al. | 219/494 |
| 2001/0044161 A1 | * | 11/2001 | Komiyama | 438/14 |
| 2002/0025375 A1 | * | 2/2002 | Takamori et al. | 427/240 |

FOREIGN PATENT DOCUMENTS

| | | |
|---|---|---|
| JP | 61125017 | 6/1986 |
| JP | 02001113 | 5/1990 |
| JP | 04115520 | 4/1992 |
| JP | 06318538 | 11/1994 |
| JP | 10214761 | 8/1998 |
| JP | 10247621 | 9/1998 |

* cited by examiner

Primary Examiner—Alexander Ghyka
(74) Attorney, Agent, or Firm—Pillsbury Winthrop LLP

(57) ABSTRACT

A heat exchange section (72) is provided in the middle of a circulation water path (58, 59) connecting between a temperature-controlled water tank (71) and a semiconductor manufacturing apparatus body (4) so as to perform a heat exchange with air of a clean room (3). The heat exchange section (72) is installed near an exit of an air circulation path (32) above a fan-filter unit (34) of the clean room as a temperature stabilized area off an atmosphere of the clean room (3). Additionally, as another method, a temperature of a chemical fluid from a chemical fluid tank (6) is controlled to be a temperature of the air in the clean room by a heat exchange section (61) provided in a location the same as above without using the temperature-controlled water so as to supply the chemical fluid to the semiconductor manufacturing apparatus body (4).

11 Claims, 10 Drawing Sheets

FIG.10

| | INITIAL COST | CONSUMED ENERGY OR RUNNING COST | | |
|---|---|---|---|---|
| | FOR TEMP. CONTROL | FOR TEMP. CONTROL (CONSUMED POWER) | FOR TEMP. CONTROL (COOLING COIL) | FOR TEMP. CONTROL (COOLING WATER) |
| CONVENTIONAL EXAMPLE (FIG.1) | TEMP. CONTROL UNIT FOR COOLING WATER 37 MILLION YEN | TEMP. CONTROL UNIT FOR COOLING WATER 367920(kWh/YEAR) 4488620(YEN/YEAR) | NO HEAT GENERATION FROM TEMP. CONTROL UNIT(ZERO) | AMOUNT OF PRODUCTION COOLING WATER 57550(kWh/YEAR) 148480(YEN/YEAR) |
| CONVENTIONAL EXAMPLE (FIG.2) | TEMP. CONTROL UNIT FOR COOLING WATER 37 MILLION YEN | TEMP. CONTROL UNIT FOR COOLING WATER 367920(kWh/YEAR) 4488620(YEN/YEAR) | COOLING COIL LOAD 38200(kWh/YEAR) 91980(YEN/YEAR) | TEMP. CONTROL UNIT FOR COOLING WATER 57550(kWh/YEAR) 148480(YEN/YEAR) |
| INVENTION (FIG.3) | PUMP. COLD WATER TUB HEAT EXCHANGER 3.5 MILLION YEN | NONE(ZERO) | NO HEAT GENERATION FROM TEMP. CONTROL UNIT(ZERO) | TEMP. CONTROL UNIT FOR COOLING WATER 32400(kWh/YEAR) 400000(YEN/YEAR) |
| INVENTION (FIG.9) | PUMP. COLD WATER TUB HEAT EXCHANGER 3.5 MILLION YEN | NONE(ZERO) | NO HEAT GENERATION FROM TEMP. CONTROL UNIT(ZERO) | TEMP. CONTROL UNIT FOR COOLING WATER 32400(kWh/YEAR) 400000(YEN/YEAR) |

DEVICE AND METHOD FOR MANUFACTURING SEMICONDUCTOR

This is the U.S. National Stage of Japanese International Application PCT/JP01/08764, which was filed in the Japanese language on Oct. 4, 2001, and which designated the U.S.

TECHNICAL FIELD

The present invention generally relates to a semiconductor manufacturing technique and, more particularly, to an apparatus and method of processing a semiconductor manufacturing substrate while supplying a temperature controlled water or chemical fluid to a body of a semiconductor manufacturing apparatus that is provided in a clean room.

BACKGROUND ART

Generally it is known that a lithography related process in a semiconductor manufacturing process (specifically, a semiconductor-circuit manufacturing process) gives large influence to an yield of a product due to conditions of a clean room, which is a manufacturing environment, for example, fluctuation in temperature and humidity. Simultaneously, it is important to control a temperature of chemical fluids and a temperature of a semiconductor wafer (hereinafter, referred to as a wafer) in a resist application and development process. For this reason, in a temperature control in a lithography process using a temperature-controlled water referred to as a production cooling water, it is required that the temperature of a chemical fluid or a wafer should be controlled to fall within a fixed range, for example, 23±0.1° C.

FIG. 1 is a schematic diagram showing a conventional example of a temperature-controlled-water supply system of an application and development apparatus, which is one of semiconductor manufacturing apparatuses. The application and development apparatus 1 is installed in a clean room CR. For example, a chemical fluid 12 is supplied from a chemical fluid tank 11 to a liquid processing unit 10 such as a resist application unit or a development unit. Additionally, a cooling water 13 is supplied so as to adjust a temperature of the chemical fluid 12 to an atmosphere temperature of the clean room CR. The cooling water 13 discharged from the liquid processing unit 10 is returned to a temperature control facility 14, and is again supplied to the liquid processing unit 10 by a pump P.

The temperature control facility 14 is provided on a floor different from the clean room CR, such as in a basement (in FIG. 1, it is shown as if arranged beside the clean room CR for the sake of convenience). The temperature control facility 14 is provided with a chiller unit containing a heat exchanger for heat exchange of the temperature-controlled water with a primary cooling water. Moreover, the temperature control facility 14 may be installed in the clean room CR as shown in FIG. 2.

In addition, a fan-filter unit 15 is provided on a ceiling section of the clean room CR, and an air circulation path 16 is provided so as to return air from a floor section to the ceiling section of the clean room CR. Moreover, an air-cooling facility 17 is provided to the air circulation path, and an external control unit 18 is provided so as to introduce an atmospheric air into the clean room CR.

Since the temperature-control range of the chemical fluids or wafers used for a lithography process is less than 23±0.1° C., for example, an amount of heat processed by the cooling water per unit time is very small. Nevertheless, a large-scaled temperature control facility has been used to carry out the temperature control of the cooling water, which has been one of causes that obstruct energy and cost reduction in operation of a semiconductor manufacturing apparatus.

Moreover, when the temperature control facility 14 is installed in the clean room CR, a primary cooling water pump, etc., serves as a heat source. For this reason, the heat dissipation from a pump is added to the cooling load (an amount of heat removed from air by the air-cooling facility 17) of a clean room, which has been one of causes of increase in a cooling cost.

DISCLOSURE OF THE INVENTION

It is a general object of the present invention to provide an improved and useful semiconductor manufacturing apparatus and semiconductor manufacturing method in which the above-mentioned problems are eliminated.

A more specific object of the present invention is to reduce a scale of a facility for controlling the temperature of the temperature-controlled water supplied to a semiconductor manufacturing apparatus.

Another object of the present invention is to reduce facilities related to a temperature-controlled water for controlling the temperature of a chemical fluid when processing a semiconductor manufacturing substrate by the chemical fluid.

In order to achieve the above-mentioned objects, there is provided according to the present invention a semiconductor manufacturing apparatus comprising: a semiconductor manufacturing apparatus body provided in a clean room; a circulation water path which circulates a temperature-controlled water supplied to the semiconductor manufacturing apparatus body; and a heat exchange section which performs a heat exchange between the temperature-controlled water in the circulation water path and air of said clean room so as to equalize a temperature of the temperature-controlled water to a temperature of the air in the clean room.

In general, a semiconductor manufacturing plant comprises a clean room, an air circulation path for returning an air exhausted from a floor section of the clean room to the clean room through a ceiling section and an air cooling facility provided to the air circulation path, and the heat exchange section is provided, for example, in one of an area above said ceiling section where a circulation air from said air circulation path passes through, a location on a downstream side of said air cooling facility in said air circulation path and a location under said ceiling section where there is no influence of other heat sources so as to perform a heat exchange between the temperature-controlled water in the circulation water path and air of said clean room to equalize a temperature of the temperature-controlled water to a temperature of the air in the clean room. Additionally, a temperature-controlled water tank and water supply means may be provided in the middle of the circulation water path. The temperature-controlled water may be used for controlling a temperature of a chemical fluid in a fluid processing unit which processes a semiconductor manufacturing substrate. Or the temperature-controlled water may pass through a temperature control unit, which controls a temperature of the semiconductor manufacturing substrate.

According to the invention, since there is no need to use a large apparatus such as a chiller unit, which is a conventionally used incidental facility equipment, a facility scale can be reduced, and an energy consumed when the facility is operated, such as an energy of a primary cooling water pump, can be saved and an operation cost can be reduced.

Additionally, there is provided according to another aspect of the present invention a semiconductor manufacturing apparatus comprising: a semiconductor manufacturing apparatus body provided in a clean room and having a fluid processing unit which processes a semiconductor manufacturing substrate by a chemical fluid; a chemical fluid supply source; a chemical fluid supply path for supplying the chemical fluid of the chemical fluid supply source to said fluid processing unit; and a heat exchange section provided in an atmosphere in the clean room so as to perform a heat exchange between the chemical fluid in the chemical fluid supply path and air of said clean room so as to equalize a temperature of the chemical fluid to a temperature of the air in the clean room. In this case also the heat exchange section can be provided in the locations explained in the above-mentioned invention. In this invention, a circulation water path may be provided for circulating the chemical fluid between said chemical fluid supply source and the heat exchange section, and the chemical fluid supply path may be branched from the circulation water path. According to this invention, since a temperature-controlled water supply facility is unnecessary and a large apparatus for controlling a temperature of the chemical fluid is unnecessary, an attempt can be made to further reduce a facility scale, save consumed energy and reduce a cost. Here, "equalize a temperature" in the phrase "equalize a temperature of the chemical fluid to a temperature of the air of the clean room" and "equalize a temperature of the temperature-controlled water a temperature of the air of the clean room" means equalizing to substantially the same temperature which does not influence the process".

Additionally, the present invention can be realized for a semiconductor manufacturing method, and the method may comprise a step of processing a semiconductor manufacturing substrate while supplying a temperature-controlled water to a semiconductor manufacturing apparatus provided in a clean room; and a step of adjusting said temperature-controlled water to be the same temperature with air of the clean room by using the air of the clean room prior to be supplied to the semiconductor manufacturing apparatus.

Additionally, another method of the present invention may comprise a step of conveying a semiconductor manufacturing substrate into a fluid processing unit provided in a clean room; a step of fluid-processing the substrate by supplying a chemical fluid to said fluid processing unit; and a step of adjusting said chemical fluid to be the same temperature as air of the clean room by using the air of the clean room before supplying to said fluid processing unit.

Other objects, features and advantages of the present invention will become more apparent from the following detailed description when read in conjunction with the accompanying drawings.

BRIEF DESCRIPTION OF THE DRAWINGS

FIG. 10 is an explanatory drawing comparing and showing consumption energy etc. with respect to the apparatus according to the present invention and the conventional apparatus.

BEST MODE FOR CARRYING OUT THE INVENTION

Figure 1:
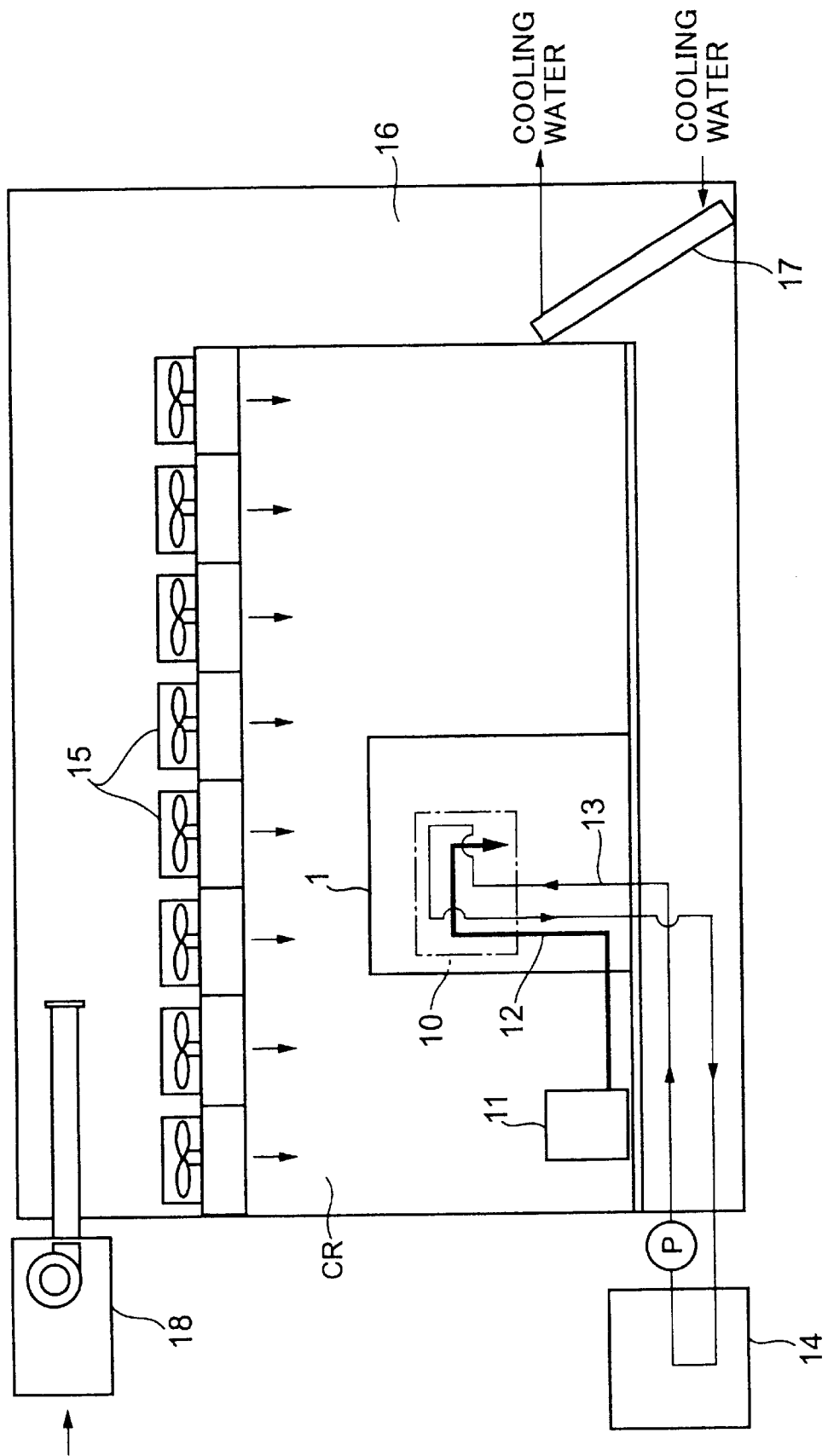
FIG. 1 is an illustrative vertical cross-sectional side elevation view showing an example of a conventional semiconductor manufacturing apparatus.

A description will be given below, with reference to drawings, of embodiments of the present invention. It should be noted that, in the drawings, equivalent parts are given the same reference numerals.

Figure 3:
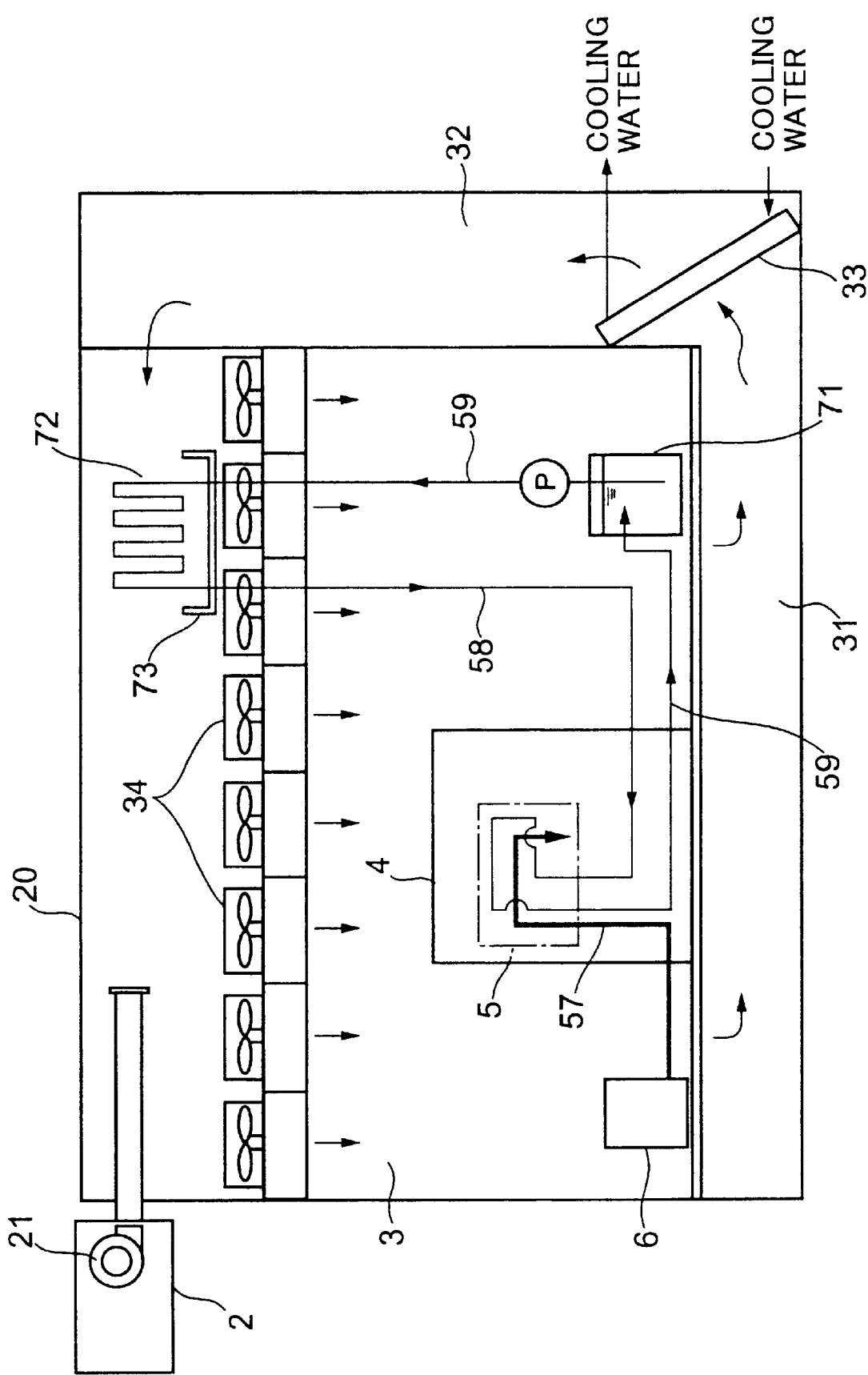
FIG. 3 is an illustrative cross-sectional side elevation view of a semiconductor manufacturing apparatus according to a first embodiment of the present invention.

FIG. 3 is an illustrative side elevation view showing a semiconductor manufacturing plant containing a semiconductor manufacturing apparatus according to a first embodiment of the present invention. First, a description will be given of the entire plant. In FIG. 3, the external control unit 2 is equipped with a heating section, a humidity control section, a cooling section, etc. other than an intake fan 21 so as to take an atmospheric air in and adjust to a predetermined temperature and humidity and supply to the plant 20. A clean room 3 is provided in the plant 20, and the ceiling side, the bottom side of the floor 31 and the outside of the side wall of the clean room 3 form an air circulation path 32. The air circulation path 32 is provided with a cooling coil (circulation coil) 33 as an air-cooling facility through which a refrigerant, for example, cooling water flows. Arranged on the ceiling section of the clean room 3 are a plurality of fan filter units (hereinafter referred to as FFU) 34 each of which is equipped with a filter section which is a ventilation resistor for removing particles and a fan for forcing air passing through inside the filter section. Air enters the clean room 3 through FFU 34, and a down flow is formed in the clean room 3.

A part of air in the clean room 3 flows into an application and development apparatus 4, and is exhausted outside from an exhaust path which is not illustrated. Other air flows into the bottom of the floor 31 through a ventilation section, which consists of, for example, a punching metal or a meshed material, of a flooring surface. The air in the bottom of the floor 31 returns to the ceiling side after being cooled to a predetermined temperature when passing through the cooling coil 33, and the air circulates within the plant 20.

As mentioned above, provided in the clean room 3 is the application and development apparatus 4, which is a semiconductor manufacturing apparatus. The application and development apparatus 4, one shown in the figure but a plurality of apparatuses are provided actually, is for applying a resist to a semiconductor manufacturing substrate such as a wafer or a liquid crystal glass substrate and developing the wafer after being exposed.

Figure 4:
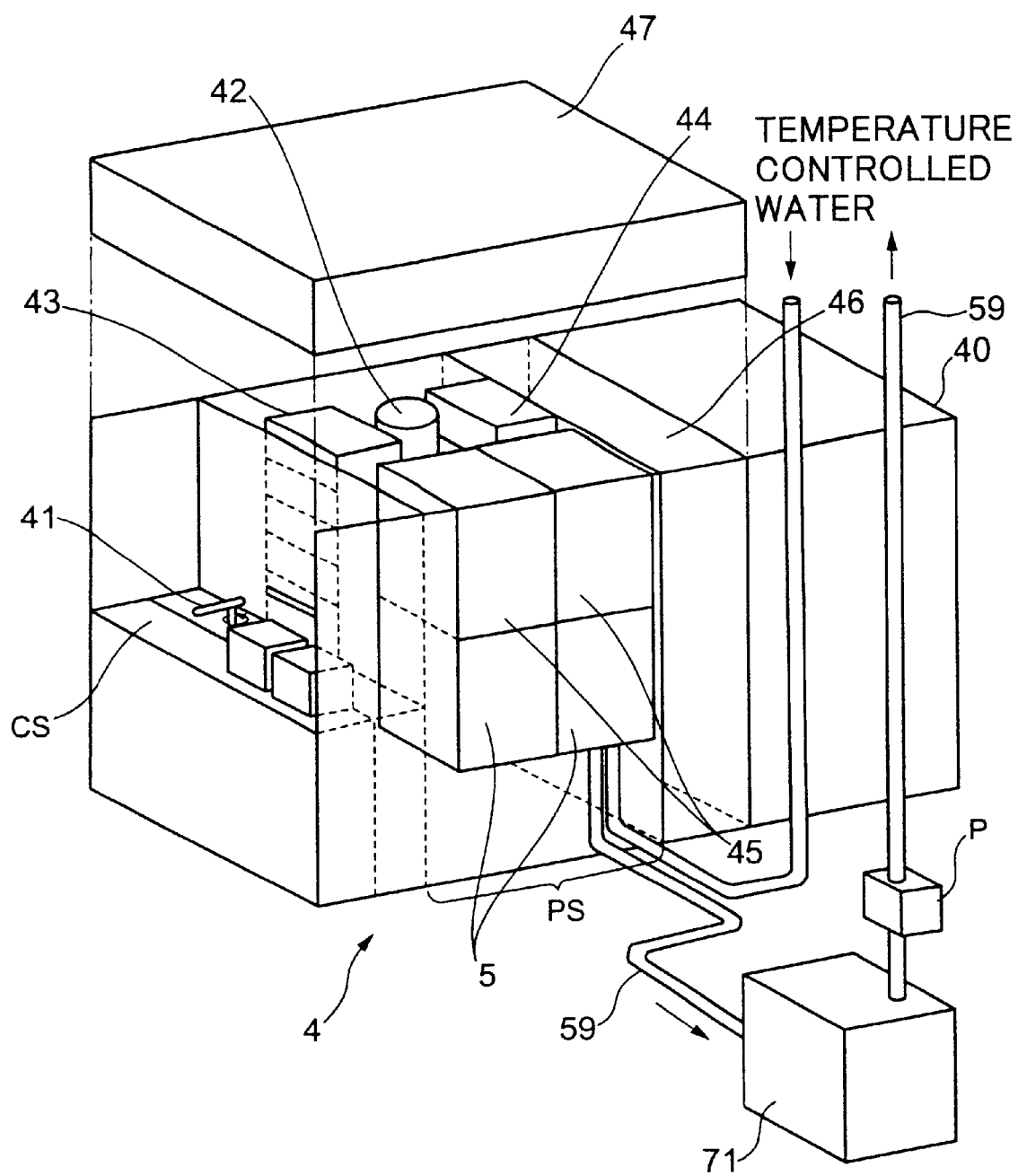
FIG. 4 is an illustrative perspective view showing an application and development apparatus, which is a semiconductor manufacturing apparatus.

FIG. 4 is a perspective view showing the application and development apparatus 4, which comprises: a carrier stage CS into which a carrier C holding 25 pieces of wafers W that are semiconductor manufacturing wafers in a shelf-like arrangement is carried in; a processing section PS performing an application and development process to the wafers W; and a delivery arm 41 delivering the wafers W between the processing section PS and the carrier stage CS.

A main transportation arm (drawn as a cylinder in rough explanation) 42, which is movable up and down and back and forth and rotatable, is provided in the center of the processing section PS. Shelves 43 and 44 are provided before and behind the main transportation arm 42 (expressed in the directions when seeing inside from the carrier stage CS), respectively. The shelves 43 and 44 are constituted by a plurality of stacked units and, specifically, a heating unit for heating the wafer and a cooling unit are assigned.

On the right-hand side of the main transportation arm 42, there is provided a development unit 45, which comprises two fluid process units, on an upper stage side and an application unit 5, which comprises two fluid process units, on a lower stage side. The main transportation 42 has a function to deliver a wafer between each unit of the shelves 43 and 44, the application unit 5 and the development unit 45. Moreover, the application and development apparatus 4 is equipped with an interface section 46, and the processing section PS is connected to the exposure apparatus 40 (not shown in FIG. 3) through the interface section 46. Furthermore, the ceiling section 47 of the application and development apparatus 4 is provided with a fan-filter unit so as to take in air (air in the clean room) outside the apparatus by the fan of the unit and supply the air inside the apparatus through the filter.

The wafer in the carrier C on the carrier stage CS is delivered to the main transportation arm 42 through a delivery unit in the shelf 42, and is heated by a heating unit of the shelf 42 (43) before and after the application of the resist in the application unit 5, respectively. Although the heat-treatment as a pretreatment is performed in a hydrophobic gas atmosphere, such a pretreatment is not performed depending on the kind of resist. Moreover, the wafer to which the exposure process has finished is heated by the heating unit of the shelf 42 (43) before and after the development unit 4, respectively.

Figure 5:
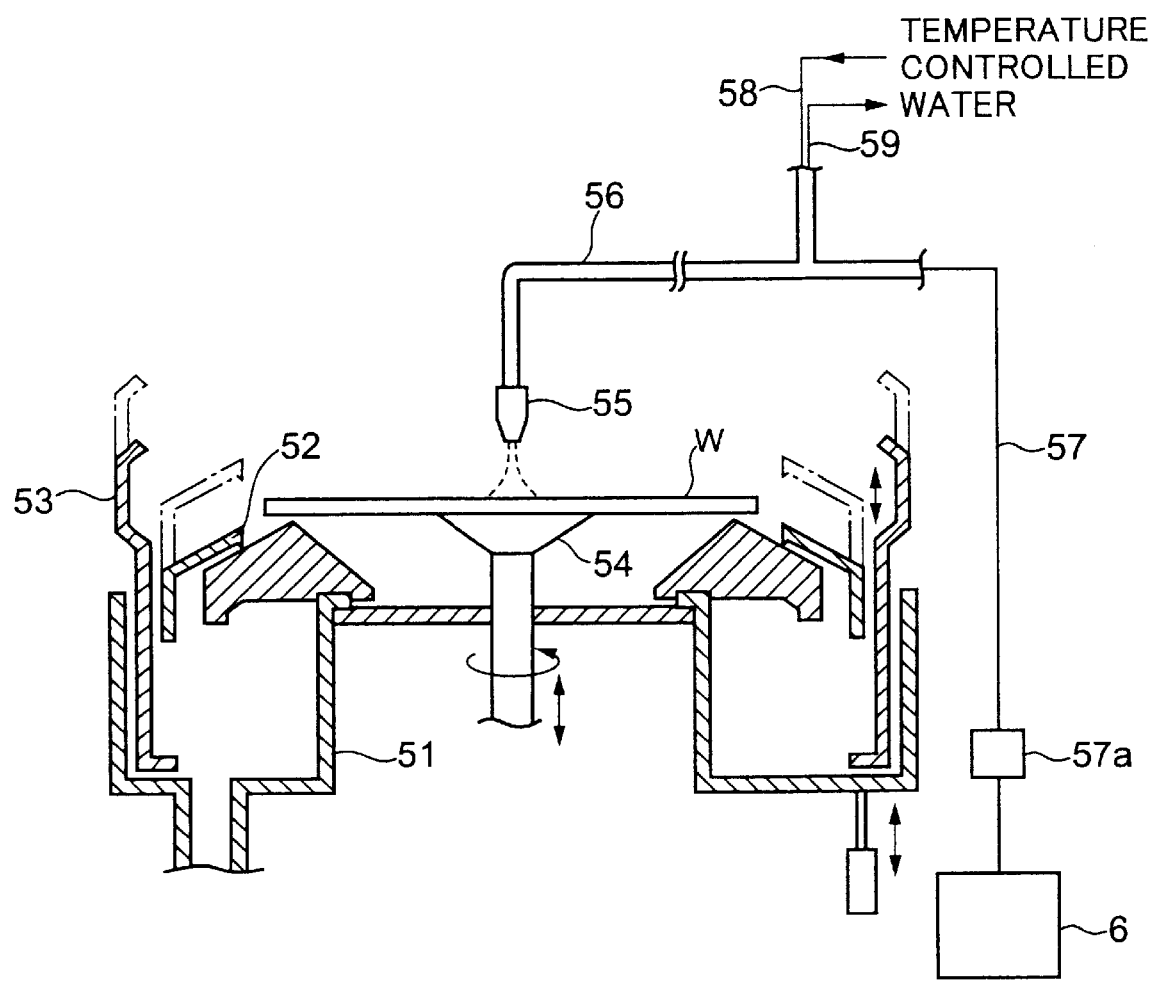
FIG. 5 is a vertical cross-sectional side elevation view showing an application unit provided in the application and development apparatus.

The application unit 5 comprises, as shown in FIG. 5, a container body 51, an inner cup 52, an outer cup 53, a spin chuck 54 and a nozzle 55. The nozzle 55 is connected to an end of a liquid supply tubing 56. The nozzle 55 and the liquid supply tubing 56 are constituted as a triple structure piping, as shown in FIG. 4, in which an inflow path 58 of the temperature controlled water such as a pure water introduced into the apparatus is arranged outside a chemical fluid piping 57 for supplying the resist as a chemical fluid and an outflow path 59 for the temperature controlled water flowing toward outside the apparatus is arranged outside the inflow path 58. The temperature-controlled water, which has flowed the inflow path 58, is U-turned within the nozzle 55, and flows out of the apparatus through the outflow path 59. In the middle of the fluid supply piping 56, the resist supply piping 57 is separated from the fluid paths 58 and 59 for the temperature-controlled water, and the chemical supply piping 57 is connected to a chemical fluid tank 6 through a pump 57a.

On the other hand, the inflow path 58 of the temperature-controlled water and the outflow path 59 are arranged outside the application and development apparatus 4, as shown in FIG. 3 and FIG. 4. The outflow path 59 is arranged to an upper space of the ceiling section of the clean room 3 through a temperature-controlled-water tank 71 and a pump P as water supply means provided in the clean room 3. A heat exchange section 72 of which one end is connected to the above-mentioned outflow path 59 is provided near the outlet side of the air circulation path 32, which is an area where an atmosphere temperature of the clean room 3 is stable on the upstream side of the above-mentioned FFU 34.

The heat exchange section 72 is for carrying out a heat exchange between the temperature-controlled water and the atmosphere in the clean room 3 so as to make the temperature-controlled water to have the same temperature as the atmosphere concerned. In order to elongate the time for the temperature-controlled water to remain in the atmosphere, the heat exchange section is constituted as a coil-like flow path or a bent flow path consisting of tubing made of, for example, plastic or metal. Moreover, a dry pan 73 constituting a fluid reservoir is provided under the heat exchange section in case for water leakage.

The inflow path 58 is connected to the other end of the heat exchange section 72, and extends in the clean room 3 from the ceiling section and is arranged in the application and development apparatus 4. The inflow path 58 and the outflow path 59 constitute the circulating water path for circulating the temperature-controlled water, and are constituted by, for example, a tube made of resin. It should be noted that although the temperature control of the chemical fluid in the application unit 5 is explained in this example, the development unit 45 also has almost the same structure and a flow path of a temperature-controlled water is formed also in the periphery of the supply pipe of a liquid developer which is a chemical fluid, and, for example, the outflow path 59 of the temperature-controlled water from the application unit 4 and the development unit 45 is unified into one in the middle, and it is connected to the temperature-controlled-water tank 71. A plurality of application and development apparatuses 4 are actually installed, and, in that case, one temperature control system, which includes the temperature-controlled-water tank 71 and the heat exchange section 72, is assigned to a predetermined number of application and development apparatuses 4.

Next, the airflow in the plant 20 will be explained. In the application and development apparatus 4, a heat exhaust, which exhausts a heat in the heating unit, is performed, and also an exhaust of atmosphere is performed by the application unit 5 or the development unit 45. An outside air is suctioned by the external control unit 2 according to an amount of the exhaust gas, and the air having a temperature and humidity adjusted therein is introduced into an upper space of the clean room 3 and is supplied to the clean room 3 in down flow through the FFU 34. The air in the clean room 3 passes through the cooling coil 33 after passing through the bottom of the floor. The heat absorbed from the heat generation source in the clean room 3 is removed by the cooling coil 33, and flows to the ceiling side after being adjusted to the predetermined atmosphere temperature, for example, 23° C., of the clean room 3. Thus, the air in the clean room circulates through inside the plant 20.

Figure 6:
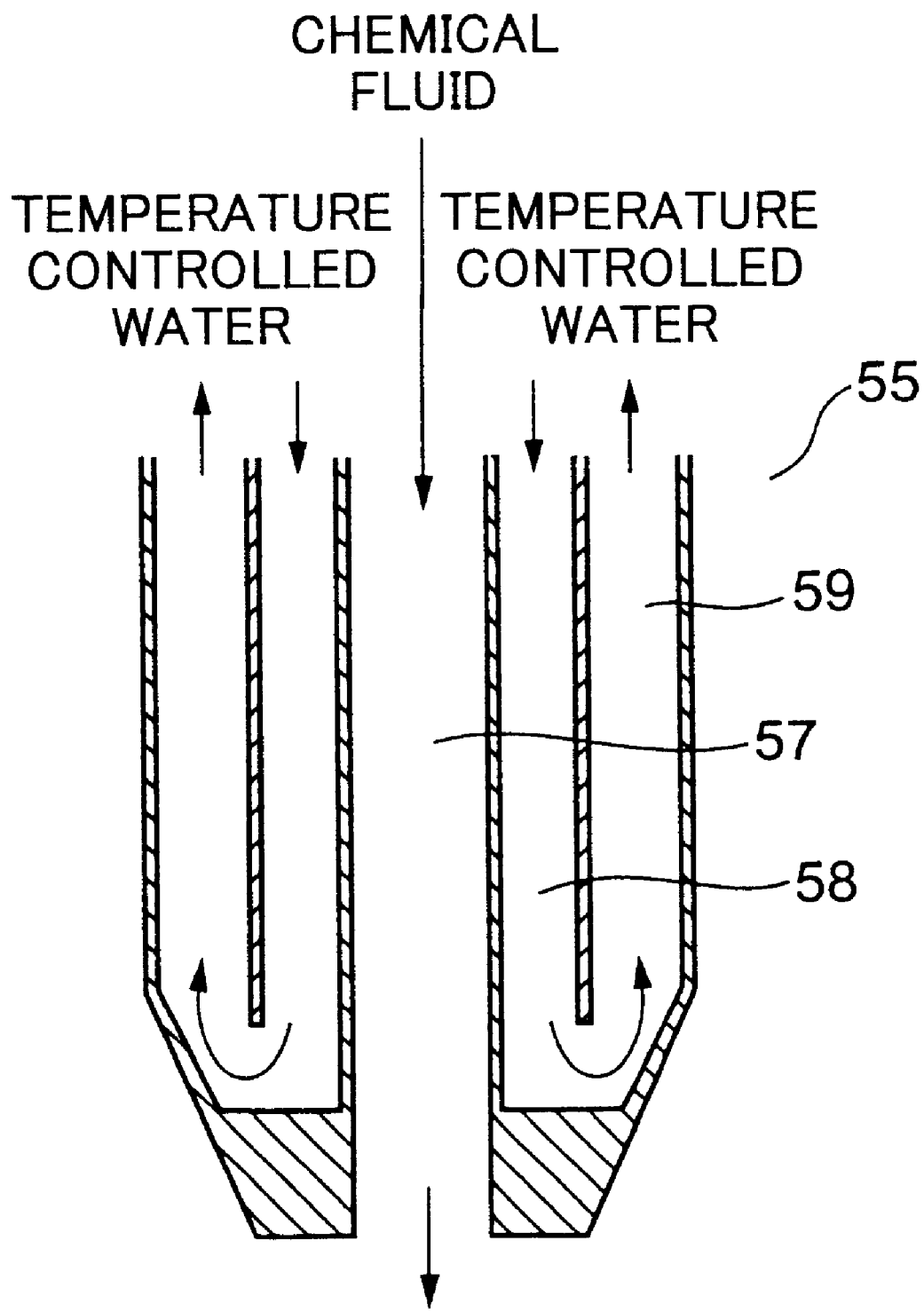
FIG. 6 is a cross-sectional view showing a nozzle of the application unit.

On the other hand, the wafer W is processed in the application and development apparatus 4 as mentioned above, and the temperature of the chemical fluid applied on the wafer W is controlled by the temperature-controlled water in the application unit 5 or the development unit 45. Although the chemical-fluid tank 6 is arranged together with the electric unit of the application and development apparatus 4 etc. and is arranged in the clean room 3, it becomes a temperature higher than the predetermined atmosphere temperature of the clean room 3 upon receiving the influence of the heat generation source etc. somewhat. As shown in FIG. 6, the temperature of the chemical fluid is controlled by the temperature-controlled water while being passed through the chemical fluid supply pipe 57 and discharged from the nozzle 55 or breathed out from the nozzle 55. For this reason, the temperature-controlled water takes heat from the chemical fluid, and the temperature rises slightly. Then, the temperature-controlled water enters the temperature-controlled-water tank 71 through the outflow path 59, and is sent to the heat exchange section 72 above the ceiling section by the pump P. While flowing through the heat exchange section 72, the temperature-controlled water exchanges heat with the atmosphere in which the heat exchange section 72 is placed, and becomes the same temperature as the atmosphere temperature concerned. Since the atmosphere is close to the exit of the air circulation path 32 and becomes the predetermined atmosphere temperature of the clean room 3 correctly, the temperature-controlled water of accurately controlled to the predetermined temperature of the clean room 3 is sent from the heat exchange section 72 to the application and development apparatus 4. It should be noted that the object of the present invention is to make the temperature-controlled water into the same temperature as the atmosphere (air) of the clean room, and the "same temperature" here has the meaning of a temperature substantially the same as a temperature which does not influence a process such as the resist application process.

Since according to the above-mentioned embodiment the heat exchange section 72 of the temperature-controlled water is provided in the area, in which the atmosphere temperature of the clean room 3 is stable, so as to control the temperature of the temperature-controlled water, there is no need to use a large apparatus such as a chiller unit, which is a conventionally used incidental facility equipment. Therefore, a facility scale can be reduced, and an energy consumed when the facility is operated, such as an energy of a primary cooling water pump, can be saved and an operation cost can be reduced. Furthermore, since the primary cooling water pump is unnecessary, corresponding heat generation, which reduces the cooling load of the clean room 3, can be reduced.

Figure 7:
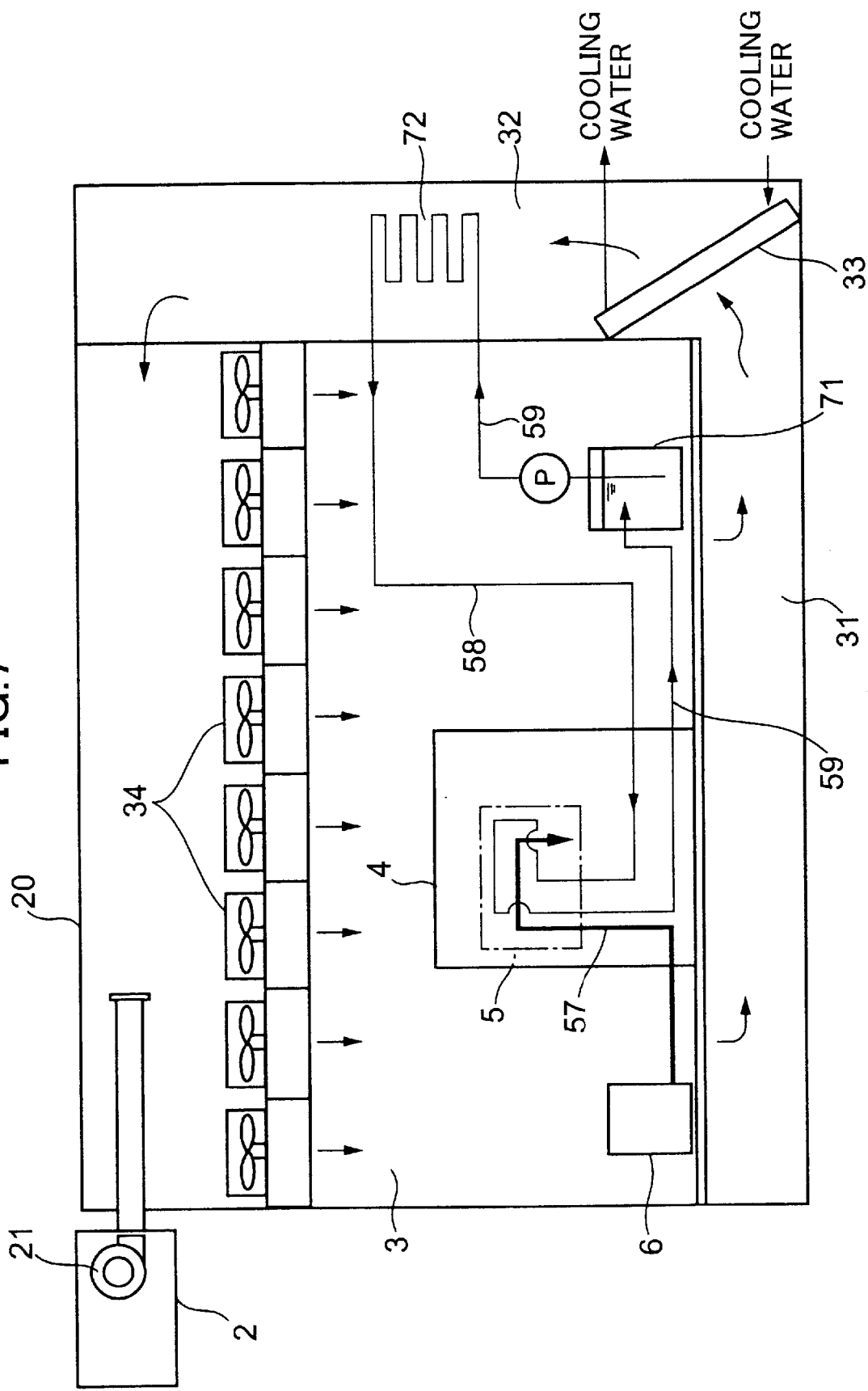
FIG. 7 is an illustrative cross-sectional side elevation view of a semiconductor manufacturing apparatus according to a second embodiment of the present invention.
Figure 8:
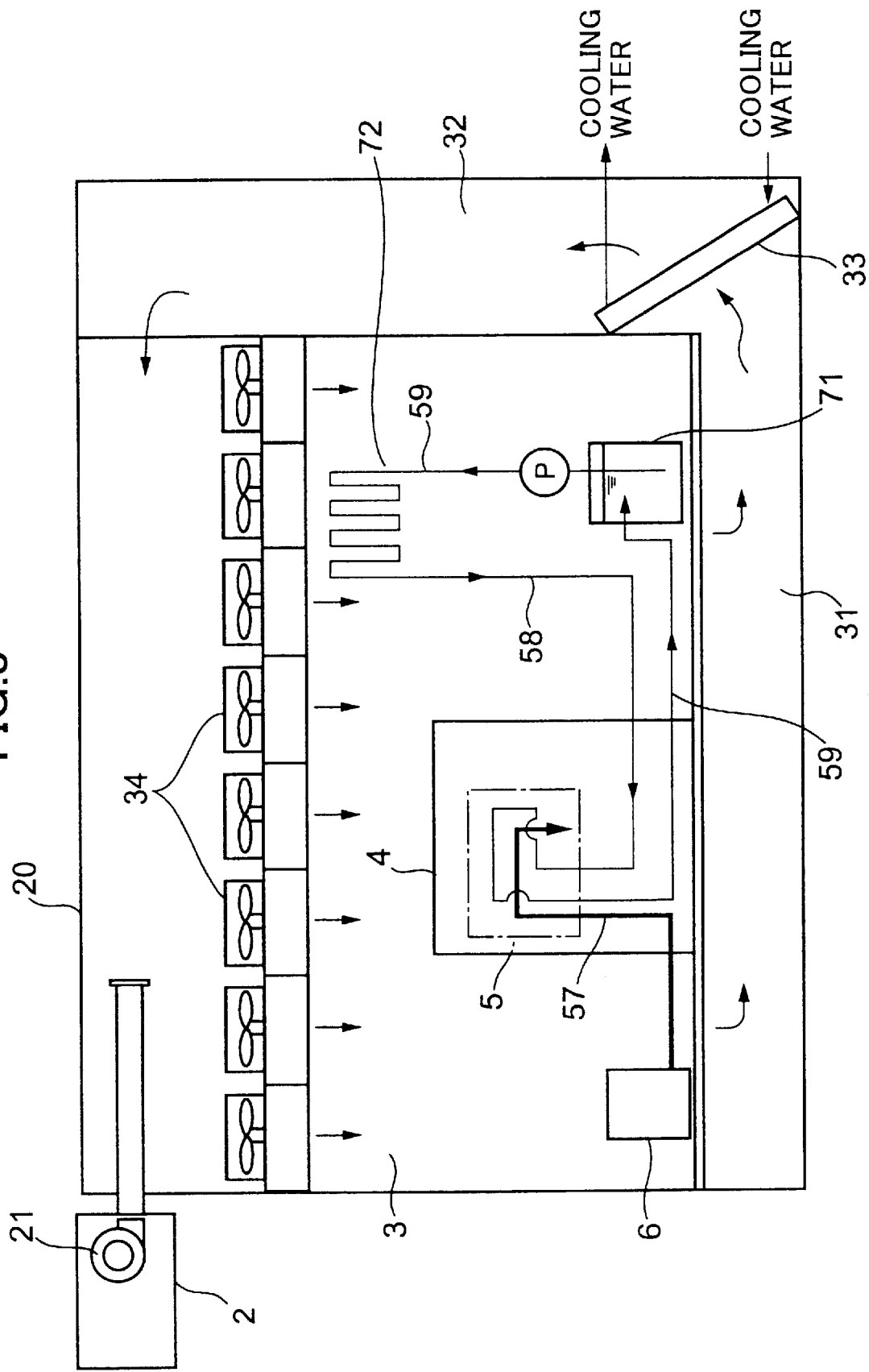
FIG. 8 is an illustrative cross-sectional side elevation view of a semiconductor manufacturing apparatus according to a third embodiment of the present invention.

In the present invention, the location of the heat exchange section 72 is not limited to the above-mentioned place if the atmosphere temperature is stable as the atmosphere temperature of the clean room 3, and the location may be on the downstream side of the cooling coil (air-cooling facility) 33 along the air circulation path 32, as shown in FIG. 7, or the location on the downstream side of the FFU 34 at which there is no influence of other, heat generation sources as shown in FIG. 8. In such a case, a dry pan 73 is preferably provided on the lower part side of the heat exchange section 72. In addition, although there is no special limitation for the location of the temperature-controlled-water tank 71, it is preferable to avoid a temperature atmosphere which is far away from the predetermined atmosphere temperature so that an amount of heat exchanged by the heat exchange section is minimized.

Figure 9:
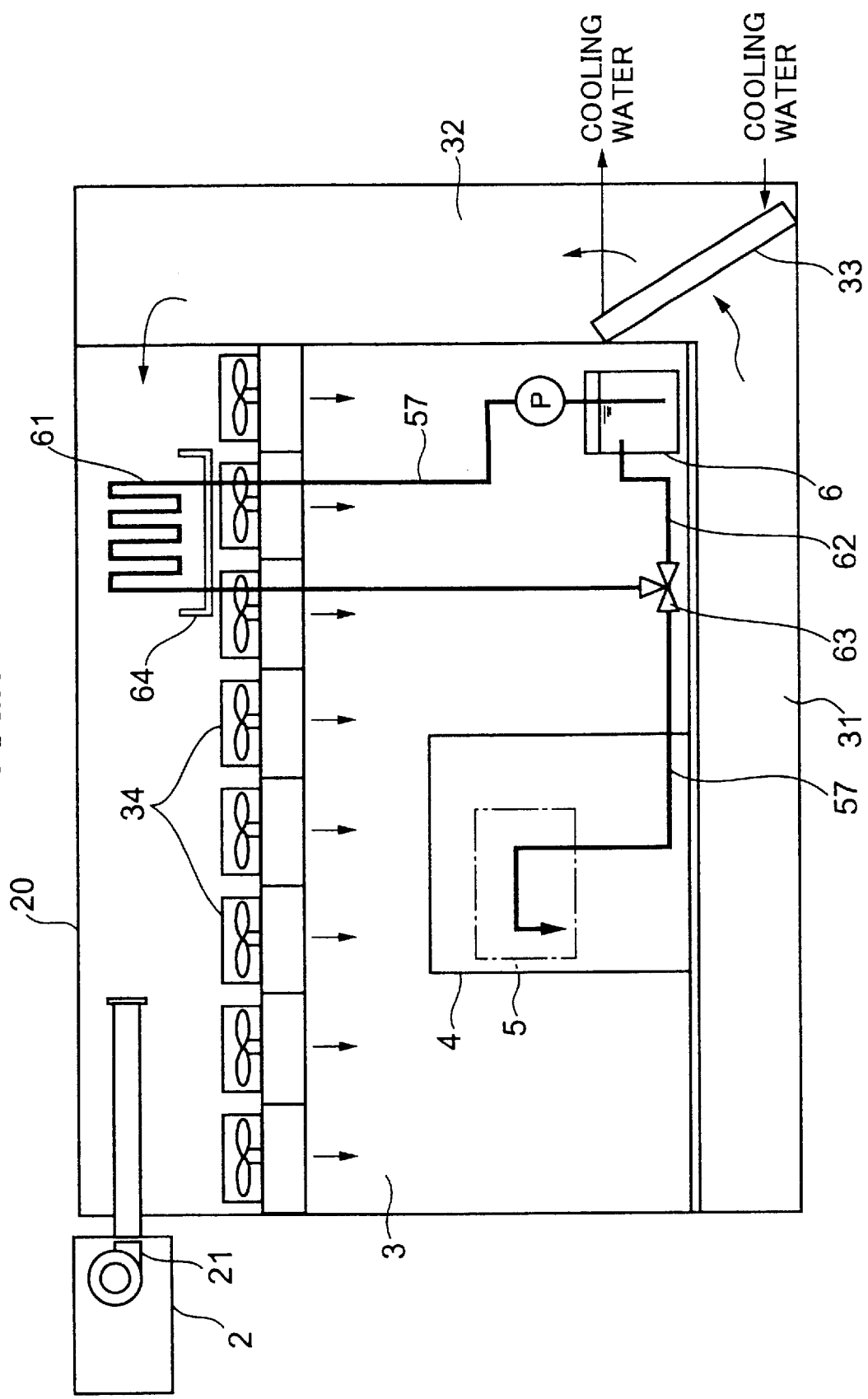
FIG. 9 is an illustrative cross-sectional side elevation view of a semiconductor manufacturing apparatus according to a fourth embodiment of the present invention.

Moreover, in the present invention, the heat exchange section may be provided in the middle of the chemical-fluid supply path 57 so as to control the temperature of the chemical fluid. FIG. 9 is an illustration showing an example of such a structure. The chemical-fluid supply path 57 connected to the chemical-fluid tank 6 as a chemical-fluid supply source is raised above the FFU 34 by the pump P which is water delivery means. The heat exchange section 61 is provided in the chemical-fluid supply path 57 at the location the same as the location of the heat exchange section 72 in the above-mentioned embodiment. The chemical-fluid supply path 57 is extended from the outlet side of the heat exchange section 61 concerned to the lower part side of the FFU 34 so as to be arranged within the application and development apparatus 4. Furthermore, a branch pipe 62 is connected to the chemical fluid tank 61 by being branched from the chemical-fluid supply path 57 between the heat exchange section 61 and the application and development apparatus 4. A three-way valve 63, which is flow path switch means, may be provided at the branch point. That is, when not using the chemical fluid, the chemical fluid is circulated so as to flow from the chemical-fluid tank 6 and return to the chemical-fluid tank 6 through the heat exchange section 61 and the branch pipe 62. When using the chemical fluid, the chemical fluid, which passed through the heat exchange section 61, is supplied to the application and development apparatus 4. For example, the heat exchange section 61 is constituted similar to the heat exchange section 72 for the temperature-controlled water, and a dry pan 64 is provided underneath.

Figure 2:
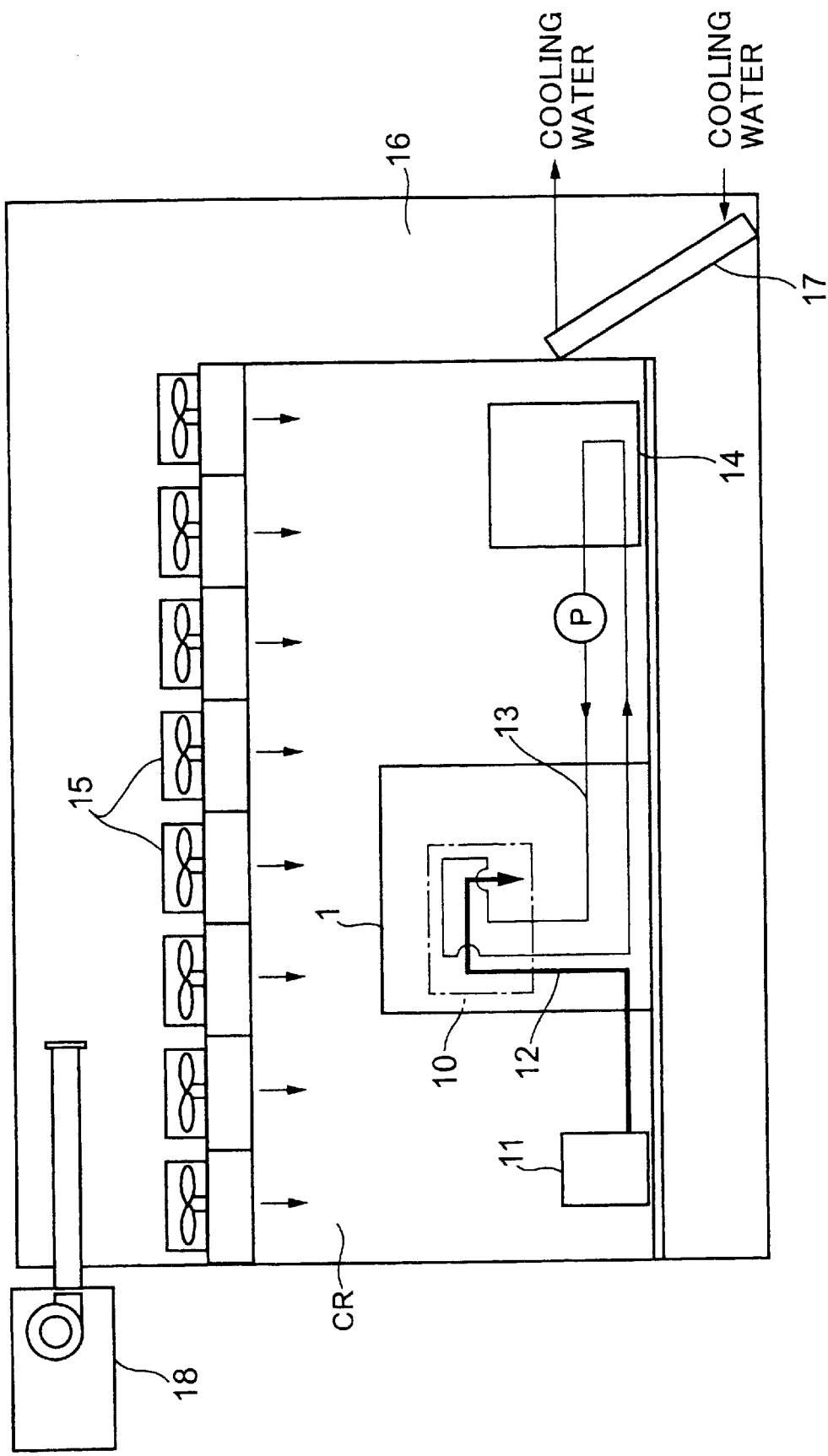
FIG. 2 is an illustrative cross-sectional side elevation view showing another example of the conventional semiconductor manufacturing apparatus.

According to the above-mentioned embodiment, the supply facility of the temperature-controlled water becomes unnecessary. Moreover, since the large-scale apparatus for the temperature control of the chemical fluid becomes unnecessary, further reduction of a facility scale, saving of consumption energy and cost reduction can be attempted. Here, FIG. 10 shows results of calculation of comparison of the cost and the power consumption related to the cooling facility (temperature control facility) of the temperature-controlled water with respect to the embodiments according to the present invention shown in FIG. 3 and FIG. 9 and the conventional examples shown in FIG. 1 and FIG. 2. In the results, the consumed energy and the running cost are values when ten temperature control units are continuously operated for one year. Specifically, an initial cost, a consumed power (kWh/year) and its electric power cost (yen/year), an amount of generated heat (kWh/year) associated with operation and its cooling cost (yen/year), and an amount of thermal loads (kWh/year) to the cooling water used during operation and its cooling cost (yen/year) are shown from the left column in a case where the conventional temperature-controlled water cooling facility is installed and operated. As appreciated from the results, the present invention is advantageous in respect of facility cost, running cost and consumption energy as compared with the conventional examples. In the above, the application of the temperature-controlled water according to the present invention is not limited to the temperature control of the chemical fluid, and may be applied to a case in which the temperature-controlled water is supplied to a temperature control unit performing a temperature control with respect to a substrate, such as for example, a cooling unit of the shelves 43 and 44 as mentioned above. In the case of the cooling unit, the substrate is cooled by being placed on a cooling plate, and the cooling water, which is the temperature-controlled water, flows through the cooling water.

The present invention is not limited to the specifically disclosed embodiments, and variations and modifications may be made without departing from the scope of the present invention.

What is claimed is:

1. A semiconductor manufacturing apparatus comprising:
    a semiconductor manufacturing apparatus body provided in a clean room;
    a circulation water path which circulates a temperature-controlled water supplied to the semiconductor manufacturing apparatus body; and a heat exchange section which performs a heat exchange between the temperature-controlled water in the circulation water path and air of said clean room so as to equalize a temperature of the temperature-controlled water to a temperature of the air in the clean room.

2. A semiconductor manufacturing apparatus provided in a semiconductor manufacturing plant comprising:

a clean room;

an air circulation path for returning air exhausted from a floor section of the clean room to the clean room through a ceiling section;

an air cooling facility provided in the air circulation path;

a semiconductor manufacturing apparatus body provided in said clean room;

a circulation water path which circulates a temperature-controlled water supplied to the semiconductor manufacturing apparatus body; and a heat exchange section provided in one of an area above said ceiling section where a circulation air from said air circulation path passes through, a location on a downstream side of said air cooling facility in said air circulation path and a location under said ceiling section where there is no influence of other heat sources so as to perform a heat exchange between the temperature-controlled water in the circulation water path and air of said clean room to equalize a temperature of the temperature-controlled water to a temperature of the air in the clean room.

3. The semiconductor manufacturing apparatus as claimed in claim 1, wherein a temperature-controlled water tank and water supply means are provided in the middle of said circulation water path.

4. The semiconductor manufacturing apparatus as claimed in claim 1, wherein the semiconductor manufacturing apparatus body has a fluid processing unit which processes a semiconductor manufacturing substrate by a chemical fluid, and the temperature-controlled water is for performing a temperature control of the chemical fluid.

5. The semiconductor manufacturing apparatus as claimed in claim 1, wherein the semiconductor manufacturing apparatus body has a temperature control unit which controls a temperature of a semiconductor manufacturing substrate, and the temperature-controlled water passes through the temperature control unit.

6. A semiconductor manufacturing apparatus comprising:

a semiconductor manufacturing apparatus body provided in a clean room and having a fluid processing unit which processes a semiconductor manufacturing substrate by a chemical fluid;

a chemical fluid supply source;

a chemical fluid supply path for supplying the chemical fluid of the chemical fluid supply source to said fluid processing unit; and a heat exchange section provided in an atmosphere in the clean room so as to perform a heat exchange between the chemical fluid in the chemical fluid supply path and air of said clean room so as to equalize a temperature of the chemical fluid to a temperature of the air in the clean room.

7. A semiconductor manufacturing apparatus provided in a semiconductor manufacturing plant, comprising:

a clean room;

an air circulation path for returning an air exhausted from a floor section of the clean room to the clean room through a ceiling section;

an air cooling facility provided to the air circulation path;

a semiconductor manufacturing apparatus body provided in the clean room and having a fluid processing unit which processes a semiconductor manufacturing substrate by a chemical fluid;

a chemical fluid supply source;

a chemical fluid supply path for supplying the chemical fluid of the chemical fluid supply source to said fluid processing unit; and a heat exchange section provided in one of an area above said ceiling section where a circulation air from said air circulation path passes through, a location on a downstream side of said air cooling facility in said air circulation path and a location under said ceiling section where there is no influence of other heat sources so as to perform a heat exchange between the chemical fluid in the chemical fluid supply path and air of said clean room to equalize a temperature of the chemical fluid to a temperature of the air in the clean room.

8. The semiconductor manufacturing apparatus as claimed in claim 6, wherein a circulation water path is provided for circulating the chemical fluid between said chemical fluid supply source and said heat exchange section, and said chemical fluid supply path is branched from the circulation water path.

9. The semiconductor manufacturing apparatus as claimed in claim 6, wherein a of the chemical fluid is not controlled by the temperature-controlled water.

10. A semiconductor manufacturing method comprising:

processing a semiconductor manufacturing substrate while supplying a temperature-controlled water to a semiconductor manufacturing apparatus provided in a clean room; and adjusting said temperature-controlled water to be the same temperature with air of the clean room by using the air of the clean room prior to be supplied to the semiconductor manufacturing apparatus.

11. A semiconductor manufacturing method comprising:

conveying a semiconductor manufacturing substrate into a fluid processing unit provided in a clean room;

fluid-processing the substrate by supplying a chemical fluid to said fluid processing unit; and adjusting said chemical fluid to be the same temperature as air of the clean room by sing the air of the clean room before supplying to said fluid processing unit.

* * * * *

UNITED STATES PATENT AND TRADEMARK OFFICE
CERTIFICATE OF CORRECTION

PATENT NO.    : 6,569,696 B2
DATED         : May 27, 2003
INVENTOR(S)   : Suenaga et al.

It is certified that error appears in the above-identified patent and that said Letters Patent is hereby corrected as shown below:

<u>Title page,</u>
Item [22], should read -- PCT Filed:  October 4, 2001 --

Signed and Sealed this

Sixth Day of January, 2004

JAMES E. ROGAN
*Director of the United States Patent and Trademark Office*